United States Patent
Satoh et al.

(10) Patent No.: US 6,187,416 B1
(45) Date of Patent: Feb. 13, 2001

(54) RESIN COMPOSITION FOR COPPER-CLAD LAMINATE, RESIN-COATED COPPER FOIL, MULTILAYERED COPPER-CLAD LAMINATE, AND MULTILAYERED PRINTED CIRCUIT BOARD

(75) Inventors: Tetsurou Satoh; Tsutomu Asai, both of Tokyo (JP)

(73) Assignee: Mitsui Mining & Smelting Co., Ltd., Tokyo (JP)

( * ) Notice: Under 35 U.S.C. 154(b), the term of this patent shall be extended for 0 days.

(21) Appl. No.: 09/186,830

(22) Filed: Nov. 5, 1998

(30) Foreign Application Priority Data

Nov. 6, 1997 (JP) .................................................. 9-319150

(51) Int. Cl.$^7$ ....................................................... B32B 3/00
(52) U.S. Cl. .......................... 428/209; 174/258; 525/423; 525/502; 525/530
(58) Field of Search .................... 525/423, 502, 525/530; 428/209; 174/258

(56) References Cited

U.S. PATENT DOCUMENTS

| | | | |
|---|---|---|---|
| 4,130,600 | * 12/1978 | Zahir et al. | 525/502 |
| 4,288,359 | *  9/1981 | Graham | 525/530 |
| 4,353,954 | * 10/1982 | Yamaoka et al. | 428/209 |
| 4,407,883 | * 10/1983 | Newton | 428/215 |
| 4,645,803 | *  2/1987 | Kohli et al. | 525/423 |
| 4,816,531 | *  3/1989 | Young | 525/502 |
| 4,822,832 | *  4/1989 | Chu et al. | 428/209 |
| 4,906,515 | *  3/1990 | Inoguchi | 428/209 |
| 5,026,789 | *  6/1991 | Weber et al. | 525/423 |
| 5,070,154 | * 12/1991 | Shiobara et al. | 525/502 |
| 5,075,155 | * 12/1991 | Jellinek et al. | 428/901 |
| 5,080,965 | *  1/1992 | Sugawara et al. | 428/209 |
| 5,300,592 | *  4/1994 | Kanagawa et al. | 525/502 |
| 5,356,691 | * 10/1994 | Yamamoto et al. | 428/209 |
| 5,439,986 | *  8/1995 | Hosogane et al. | 525/423 |
| 5,462,996 | * 10/1995 | Portelli et al. | 525/423 |
| 5,565,267 | * 10/1996 | Capote et al. | 428/901 |
| 5,644,003 | *  7/1997 | Arai et al. | 525/423 |
| 5,677,393 | * 10/1997 | Ohmori et al. | 525/423 |
| 5,908,901 | *  6/1999 | White | 525/530 |
| 5,965,245 | * 10/1999 | Okano et al. | 174/258 |

* cited by examiner

*Primary Examiner*—Cathy Lam
(74) *Attorney, Agent, or Firm*—Jenkens & Gilchrist

(57) ABSTRACT

There are provided a resin composition for copper-clad laminates which comprises the following ingredients: (a) an epoxy resin mixture comprising an epoxy resin and a hardener therefor, (b) a maleimide compound, and (c) at least one solvent-soluble aromatic polymer having at least one functional group polymerizable with the epoxy resin or the maleimide compound, and also provided a resin-coated copper foil, a multilayered copper-clad laminate and a multilayered printed circuit board each using the resin composition.

15 Claims, No Drawings

RESIN COMPOSITION FOR COPPER-CLAD LAMINATE, RESIN-COATED COPPER FOIL, MULTILAYERED COPPER-CLAD LAMINATE, AND MULTILAYERED PRINTED CIRCUIT BOARD

BACKGROUND OF THE INVENTION

1. Field of the Invention

The present invention relates to a multilayered printed circuit board having excellent heat resistance and to a resin composition for copper-clad laminates, a resin-coated copper foil, and a multilayered copper-clad laminate each suitable for use in producing the circuit board.

2. Prior Art

Laminates for use in producing printed circuit boards in the electronic industry are frequently produced by impregnating a glass cloth, craft paper, nonwoven glass fabric, or the like with a thermosetting resin such as a phenolic or epoxy resin, semicuring the resin to obtain a prepreg, and laminating the prepreg on one or each side to a copper foil. Furthermore, a multilayered printed circuit board is also produced by forming a circuit on each side of the above copper-clad laminate to obtain an inner-layer material and cladding the same on each side with a copper foil by interposing a prepreg therebetween.

With the trend toward the high densification of printed circuit boards, the formation of so-called via holes, which are minute holes not extending through the board thickness, has recently become very common. Such via holes are formed by means of a laser beam or plasma processing. Since use of a prepreg containing an inorganic ingredient, such as glass fibers, as an insulating layer results in poor processability in processing with a laser beam or plasma, resins containing no inorganic ingredients are frequently used as insulating layers. In this case, there are three methods for forming a resin layer using resins containing no inorganic ingredients, namely, the resin layer is formed by (1) directly applying a liquid resin to an inner circuit, (2) a resin film made of a semicured thermosetting resin, or (3) applying a resin to one side of a copper foil and semicuring the resin. The thus formed resin layer is laminated to a printed circuit board having a circuit (an inner-layer material), before the outer-layer copper foil is subjected to circuit formation and via hole formation to produce a multilayered printed circuit board.

The method in which a liquid resin is directly applied onto an inner circuit has problems that it is difficult to apply the resin with good thickness precision, and that polishing and other steps require much labor when a circuit is formed through plating. In the case of using a resin film, which is produced by applying a resin composition to a plastic film, there is a problem that the plastic film, which is discarded after use, is costly. Hence, the method in which a resin-coated copper foil is used is more common. As the resin ingredient, an epoxy resin is frequently used. Epoxy resins can fully satisfy the property requirements in general printed circuit boards because they are excellent in electrical insulating properties and chemical resistance. However, epoxy resins have limited heat resistance and, hence, there have been cases where they cannot be used as a material for printed circuit boards required to have high heat resistance.

The present inventors proposed the use of a resin composition comprising the following ingredients as a resin ingredient for a resin-coated copper foil (Japanese Patent Application No. 176565/1997).

(1) An epoxy resin and a hardener therefor, in a content of 40 to 80 parts by weight per 100 parts by weight of the total amount (2) A maleimide compound in a content of 10 to 50 parts by weight per 100 parts by weight of the total amount (3) A polyvinyl butyral resin having at least one polymerizable double bond as a functional group, in a content of 5 to 30 parts by weight per 100 parts by weight of the total amount Due to the above makeup, not only the resin can have greatly improved heat resistance, but also the brittleness of the maleimide compound can be reduced.

However, the above resin composition has a problem that it has an increased coefficient of thermal expansion at high temperatures because of the use of a polyvinyl butyral resin. An increase in the coefficient of thermal expansion may cause problems such as cracking in a severe thermal cycle test, etc. and position shifting after parts mounting.

Accordingly, an object of the present invention is to provide a resin composition for copper-clad laminates which has a low coefficient of thermal expansion and high heat resistance and has extremely high crack resistance even upon undergoing a mechanical or thermal shock, thereby eliminating the above-described technical problems of prior art techniques, and to provide a resin-coated copper foil made by using the resin composition.

Another object of the present invention is to provide a multilayered copper-clad laminate and a multilayered printed circuit board both obtained using the resin composition for copper-clad laminates, which has such high heat resistance and high crack resistance, and using the resin-coated copper foil.

SUMMARY OF THE INVENTION

The present inventors have made extensive studies in order to eliminate the problems described above. As a result, the present invention has been achieved which can eliminate the above technical problems of prior art techniques by using a resin composition for copper-clad laminates which comprises an epoxy resin mixture comprising an epoxy resin and a hardener therefor, a maleimide compound not containing a hydroxyl group, and a solvent-soluble aromatic polymer having at least one functional group polymerizable with the epoxy resin or the maleimide compound.

The resin composition for copper-clad laminates of the present invention is characterized by comprising the following ingredients: (a) an epoxy resin mixture comprising an epoxy resin and a hardener therefor, (b) a maleimide compound, and (c) at least one solvent-soluble aromatic polymer having at least one functional group polymerizable with the epoxy resin or the maleimide compound.

The resin-coated copper foil of the present invention is characterized by being obtained by coating a copper foil on one side with the resin composition for copper-clad laminates of the present invention as an interlaminar insulating resin ingredient for a multilayered printed circuit board.

The multilayered copper-clad laminate of the present invention comprises an insulating base layer, an inner circuit formed on one or each side of the insulating base layer, and a copper foil serving as a layer for an outer circuit and formed outside the inner circuit through an insulating resin layer, and is characterized in that the insulating resin layer interposed between the inner circuit and the copper foil serving as a layer for an outer circuit is a layer formed from the resin composition for copper-clad laminates of the present invention.

The multilayered printed circuit board of the present invention comprises an insulating base layer, an inner circuit formed on one or each side of the insulating base layer, and an outer circuit formed outside the inner circuit through an insulating resin layer, and is characterized in that the insulating resin layer interposed between the inner circuit and the outer circuit is a layer formed from the resin composition for copper-clad laminates of the present invention.

The resin composition for copper-clad laminates of the present invention will be explained below in more detail.

Of the epoxy resin and the hardener therefor both used in the resin composition for copper-clad laminates of the present invention, the epoxy resin is not particularly limited. Any kind of epoxy resin may be used as long as it is for use as an electrical/electronic material. Examples thereof include bisphenol A epoxy resins, bisphenol F epoxy resins, novolak epoxy resins, cresol-novolak epoxy resins, tetrabromobisphenol resins, and glycidylamine epoxy resins. These epoxy resins may be used in combination of two or more thereof.

The epoxy resin hardener is preferably a so-called latent hardener which has low activity at room temperature and cures upon heating, such as, e.g., dicyandiamide, imidazole or an analogue thereof, an aromatic amine, a phenolic novolak resin, or a cresol-novolak resin, because it is for use in producing a resin-coated copper foil. It is preferred to use a curing accelerator which accelerates the reaction of the epoxy resin with the hardener. Although a tertiary amine, imidazole, or an analogue thereof can be used as the curing accelerator, imidazole or its analogue is preferable because it functions also as a curing accelerator for the maleimide compound.

The content of the epoxy resin mixture is desirably 40 to 80 parts by weight per 100 parts by weight of the whole resin composition. If the content thereof is lower than 40 parts by weight, impaired adhesiveness results. If the content thereof exceeds 80 parts by weight, the effect of improving heat resistance is not expected.

The maleimide compound is preferably a compound such as N,N'-(4,4-diphenylmethane)bismaleimide, bis(3-ethyl-5-methyl-4-maleimidophenyl)methane, or 2,2-bis[4-(4-maleimidophenoxy)phenyl]propane. The content of the maleimide compound is desirably 10 to 50 parts by weight per 100 parts by weight of the whole resin composition. If the content thereof is lower than 10 parts by weight, sufficient heat resistance cannot be ensured. If the content thereof exceeds 50 parts by weight, the resin composition gives a cured article which is extremely brittle and has significantly impaired crack resistance.

The solvent-soluble aromatic polymer having at least one functional group polymerizable with the epoxy resin or the maleimide compound may be a polyethersulfone resin, aromatic polyamide resin, polyamide-imide resin, or the like which each has at least one phenolic hydroxyl, carboxyl, or amino group in the molecule or at a molecular end. These aromatic polymers may be used in combination of two or more thereof. Although these resins are not particularly limited in Tg (glass transition temperature) or molecular weight, they desirably have a Tg of 150° C. or higher in order to pass a thermal cycle test in the range of from −65° C. to +150° C. Since these resins are used as substitutes for polyvinyl acetal resins used for reducing the brittleness of resin compositions, they need to have the same tensile strength and film-forming properties as the polyvinyl acetal resins.

The concentration of functional groups polymerizable with the epoxy resin or the maleimide compound should be at least one per molecule from the standpoint of ensuring sufficient heat resistance. The solvent-soluble aromatic polymer having at least one functional group polymerizable with the epoxy resin or the maleimide compound is used desirably in an amount of 5 to 30 parts by weight per 100 parts by weight of the whole resin composition. If the amount thereof is smaller than 5 parts by weight, the effect of improving crack resistance cannot be produced. If the amount of the aromatic polymer exceeds 30 parts by weight, it has impaired compatibility and polymerizability with the epoxy resin and the bismaleimide compound.

Besides the essential ingredients described above, other resin ingredients may be added unless this does not depart from the spirit of the present invention. Examples of such optional resin ingredients include thermosetting polyimide resins, urethane resins, phenolic resins, and phenoxy resins. The addition of these resins is effective in improving flame-proofing properties, resin flowability, etc.

DESCRIPTION OF THE PREFERRED EMBODIMENTS

The present invention will be explained below by reference to Examples and Comparative Example.

EXAMPLE 1

1-1) Epoxy resin

An epoxy resin was obtained by blending bisphenol A epoxy resin Epomic R-140 (trade name; manufactured by Mitsui Petrochemical Industries Ltd.) with o-cresol-novolak epoxy resin Epo Tohto YDCN-704 (trade name; manufactured by Toto Kasei K.K.) in a weight ratio of 100:100.

1-2) Epoxy resin hardener

Mirex XL-225 (trade name; manufactured by Mitsui Toatsu Chemicals, Inc.) was added to the above epoxy resin in a ratio of 1:1.

1-3) Epoxy resin curing accelerator

Curezol 2PZ (trade name; manufactured by Shikoku Kasei Co., Ltd.) was added in an amount of 1 part by weight to the epoxy resin.

The epoxy resin, epoxy resin hardener, and epoxy resin curing accelerator were dissolved in dimethylformamide in a concentration of 50% to prepare an epoxy resin mixture.

2) Bismaleimide compound

Bis(3-ethyl-5-methyl-maleimidophenyl)methane was used.

3) Aromatic polymer having functional group polymerizable with epoxy resin or maleimide compound A polyethersulfone resin was used which had a hydroxyl equivalent of about 1,500 and a glass transition temperature of about 230° C.

These ingredients were mixed in the proportion shown in Table 1 to prepare a resin composition.

TABLE 1

| | Proportion |
|---|---|
| Epoxy resin mixture | 60 parts by weight (on solid basis) |
| Bismaleimide compound | 20 parts by weight |
| Polyethersulfone | 20 parts by weight |
| N-Methylpyrrolidone | to adjust the solid content of the whole composition to 40 wt. % |

The resin composition was applied to a matte surface side of an electrolytic copper foil having a thickness of 18 μm. The coating was air-dried and then heated at 140° C. for 5 minutes to obtain a resin-coated copper foil having a semi-icured resin layer. The thickness of the resin layer was 100 to 105 μm. This resin-coated copper foil was heated at 200° C. for 4 hours at ordinary pressure. After cooling, the copper foil was removed by etching to obtain a cured resin film.

An inner-layer material FR-4 having a prescribed circuit (core thickness, 0.5 mm; copper foil thickness, 35 μm) was sandwiched between two sheets of the resin-coated copper foil in such a manner that the resin layer of each resin-coated copper foil was in contact with a surface of the inner-layer material. The resultant assemblage was hot-pressed at 20 kgf/cm$^2$ and 200° C. for 4 hours to obtain a multilayered copper-clad printed circuit board having four copper foil layers.

EXAMPLE 2

A resin-coated copper foil, a cured resin film, and a multilayered printed circuit board were obtained in the same manner as in Example 1, except that an aromatic polyamide resin having a hydroxyl equivalent of 8,000 and a Tg of 203° C. was used in place of the polyethersulfone used in Example 1.

COMPARATIVE EXAMPLE 1

1-1) Epoxy resin

An epoxy resin was obtained by blending bisphenol A epoxy resin Epomic R-140 (trade name; manufactured by Mitsui Petrochemical Industries Ltd.) with o-cresol-novolak epoxy resin Epo Tohto YDCN-704 (trade name; manufactured by Toto Kasei K.K.) in a weight ratio of 100:100.

1-2) Epoxy resin hardener

Mirex XL-225 (trade name; manufactured by Mitsui Toatsu Chemicals, Inc.) was added to the above epoxy resin in a ratio of 1:1.

1-3) Epoxy resin curing accelerator

Curezol 2PZ (trade name; manufactured by Shikoku Kasei Co., Ltd.) was added in an amount of 1 part by weight to the epoxy resin.

The epoxy resin, epoxy resin hardener, and epoxy resin curing accelerator were dissolved in dimethylformamide in a concentration of 50% to prepare an epoxy resin mixture.

2) Bismaleimide compound

Bis(3-ethyl-5-methyl-4-maleimidophenyl)methane was used.

3) Polyvinyl acetal resin having functional group polymerizable with epoxy resin or maleimide compound A carboxylated polyvinyl acetal resin was used which had a degree of acetalization of 80, an acetaldehyde/butyraldehyde ratio of 50/50 (by mol), a hydroxyl concentration of 17 wt. %, and a carboxyl concentration of 1 wt. % and which had been obtained from a polyvinyl alcohol having a degree of polymerization of 2,400.

These ingredients were mixed in the proportion shown in Table 2 to prepare a resin composition.

TABLE 2

| | Proportion |
|---|---|
| Epoxy resin mixture | 60 parts by weight (on solid basis) |
| Bismaleimide compound | 20 parts by weight |
| Polyvinyl acetal resin | 20 parts by weight |
| Methyl ethyl ketone | to adjust the solid content of the whole composition to 30 wt. % |

The resin composition was applied to a matte surface side of an electrolytic copper foil having a thickness of 18 μm. The coating was air-dried and then heated at 120° C. for 5 minutes to obtain a resin-coated copper foil having a semicured resin layer. The thickness of the resin layer was 100 to 105 lam. This resin-coated copper foil was heated at 200° C. for 4 hours at ordinary pressure. After cooling, the copper foil was removed by etching to obtain a cured resin film.

An inner-layer material FR-4 having a prescribed circuit (core thickness, 0.5 mm; copper foil thickness, 35 μm) was sandwiched between two sheets of the resin-coated copper foil in such a manner that the resin layer of each resin-coated copper foil was in contact with a surface of the inner-layer material. The resultant assemblage was hot-pressed at 20 kgf/cm$^2$ and 200° C. for 4 hours to obtain a multilayered copper-clad printed circuit board having four copper foil layers.

The resin films and multilayered printed circuit boards produced in Examples 1 and 2 and Comparative Example 1 were evaluated for the following properties.

(1) Resin film (i) Measurement of Tg (glass transition temperature) with an apparatus for measuring dynamic viscoelasticity.

(2) Multilayered printed circuit board (i) Measurement of the coefficient of thermal expansion at 150 to 200° C. by TMA.

(ii) Crack resistance was evaluated by forming a copper circuit having a line width of 100 μm and via holes each having a via hole diameter of 150 μm and a land diameter of 350 μm in an outer-layer copper foil of each circuit board by etching, subsequently subjecting the circuit board to either a thermal shock test consisting of 300 cycles each ranging from −50° C. (30 minutes) to +125° C. (30 minutes) (thermal shock resistance A) or a thermal shock test consisting of 1,000 cycles each ranging from −65° C. (30 minutes) to +150° C. (30 minutes) (thermal shock resistance B), and then examining a section thereof for resin cracks.

(iii) Oil-dip heat resistance test consisting of 100 cycles each including 10-second immersion in a 260° C. oil and air cooling.

The results obtained in the above tests are given in Tables 3 and 4.

These test results show that in the resin-coated copper foils of the present invention, the resin layers had high heat resistance and low coefficients of thermal expansion. The multilayered printed circuit boards produced using these copper foils were satisfactory in heat resistance and thermal shock resistance.

TABLE 3

| | Tg (° C.) | Coefficient of thermal expansion (ppm/° C.) |
|---|---|---|
| Example 1 | 225 | 57 |
| Example 2 | 203 | 55 |
| Comparative Example 1 | 186 | 80 |

TABLE 4

| | Thermal shock resistance A | Thermal shock resistance B | Oil-dip heat resistance C |
|---|---|---|---|
| Example 1 | ◎ | ◎ | ○ |
| Example 2 | ◎ | ◎ | ○ |
| Comparative Example 1 | ○ | X | ○ |

◎: excellent,
○: no cracks in resin layer,
X: microcracks in resin layer

[Effects of the Invention]

The resin-coated copper foil of the present invention can be produced by applying the resin composition of the present invention, obtained by the method described above and having excellent resistance to heat and cracking, to one side of a copper foil as an interlaminar insulating resin ingredient for a multilayered printed circuit board.

The multilayered copper-clad laminate of the present invention, which comprises an insulating base layer, an inner circuit formed on one or each side of the insulating base layer, and a copper foil serving as a layer for an outer circuit and formed outside the inner circuit through an insulating resin layer, can be produced by using the resin composition of the present invention, obtained by the method described above and having excellent resistance to heat and cracking, to form the insulating resin layer interposed between the inner circuit and the copper foil serving as a layer for an outer circuit.

Furthermore, the multilayered printed circuit board of the present invention, which comprises an insulating base layer, an inner circuit formed on one or each side of the insulating base layer, and an outer circuit formed outside the inner circuit through an insulating resin layer, can be produced by using the resin composition of the present invention, obtained by the method described above and having excellent resistance to heat and cracking, to form the insulating resin layer interposed between the inner circuit and the outer circuit.

What is claimed is:

1. A resin-coated copper foil obtained by coating a copper foil on one side with a resin composition as an interlaminar insulating resin for a multilayered printed circuit board, said resin composition comprising:

(a) an epoxy resin mixture comprising an epoxy resin and a hardener therefore, (b) a maleimide compound, and (c) a polyethersulfone resin polymerizable with the epoxy resin.

2. A resin-coated copper foil of claim 1, wherein said resin composition comprises 40 to 80 parts by weight of the epoxy resin mixture, 10 to 50 parts by weight of the maleimide compound, and 5 to 30 parts by weight of the polyethersulfone resin polymerizable with said epoxy resin, per 100 parts by weight of the total amount of the resin composition.

3. A resin-coated copper foil of claim 1, wherein said epoxy resin mixture further comprises a curing accelerator for epoxy resin and its hardener.

4. A resin-coated copper foil as set forth in claim 1, wherein said resin composition comprises 40 to 80 parts by weight of the epoxy resin mixture, 10 to 50 parts by weight of the maleimide compound, and 5 to 30 parts by weight of the polyethersulfone resin polymerizable with said epoxy resin, per 100 parts by weight of the total amount of the resin composition.

5. A resin-coated copper foil as set forth in claim 1, wherein said epoxy resin mixture further comprises a curing accelerator for epoxy resin and its hardener.

6. A multilayered copper-clad laminate which comprises an insulating base layer having two sides, an inner circuit formed on at least one side of the insulating base layer, a copper foil serving as a layer for an outer circuit, and an insulating layer disposed between said insulating base having an inner circuit formed thereon and said copper foil, characterized in that said insulating resin comprises:

(a) an epoxy resin mixture comprising an epoxy resin and a hardener therefore, (b) a maleimide compound, and (c) a polyethersulfone resin polymerizable with the epoxy resin.

7. A multilayered copper-clad laminate as set for in claim 6, wherein said insulating resin layer comprises 40 to 80 parts by weight of the epoxy resin mixture, 10 to 50 parts by weight of the maleimide compound, and 5 to 30 parts by weight of the polyethersulfone resin polymerizable with the epoxy resin, per 100 parts by weight of the total amount of the resin composition.

8. A multilayered copper-clad laminate as set forth in claim 6, wherein said epoxy resin mixture further comprises a curing accelerator for epoxy resin and its hardener.

9. A multilayered copper-clad laminate of claim 6, wherein said insulating resin layer comprises 40 to 80 parts by weight of the epoxy resin mixture, 10 to 50 parts by weight of the maleimide compound, and 5 to 30 parts by weight of the polyethersulfone resin polymerizable with said epoxy resin, per 100 parts by weight of the total amount of the resin composition.

10. A multilayered copper-clad laminate of claim 9 wherein said epoxy resin mixture further comprises a curing accelerator for epoxy resin and its hardener.

11. A multilayered printed circuit board which comprises an insulating base layer having two sides, an inner circuit formed on at least one side of the insulating base layer, an outer circuit and an insulating layer disposed between said insulating base having an inner circuit formed thereon and said outer circuit, characterized in that said insulating resin layer comprises:

(a) an epoxy resin mixture comprising an epoxy resin and a hardener therefore, (b) a maleimide compound, and (c) a polyethersulfone resin polymerizable with the epoxy resin.

12. A multilayered printed circuit board as set forth in claim 11, wherein said insulating resin layer comprises 40 to 80 parts by weight of the epoxy resin mixture, 10 to 50 parts by weight of the maleimide compound, and 5 to 30 parts by weight of the polyethersulfone resin polymerizable with the epoxy resin, per 100 parts by weight of the total amount of the resin composition.

13. A multilayered printed circuit board as set forth in claim 11, wherein said epoxy resin mixture further comprises a curing accelerator for epoxy resin and its hardener.

14. A multilayered printed circuit board of claim 11, wherein said insulating resin layer comprises 40 to 80 parts by weight of the epoxy resin mixture, 10 to 50 parts by weight of the maleimide compound, and 5 to 30 parts by weight of the polyethersulfone resin polymerizable with said epoxy resin, per 100 parts by weight of the total amount of the resin composition.

15. A multilayered printed circuit board of claim 14, wherein said epoxy resin mixture further comprises a curing accelerator for epoxy resin and its hardener.

* * * * *